United States Patent
Nambu

(10) Patent No.: US 9,466,503 B2
(45) Date of Patent: Oct. 11, 2016

(54) METHOD OF MANUFACTURING SEMICONDUCTOR DEVICE

(71) Applicant: RENESAS ELECTRONICS CORPORATION, Kawasaki-Shi (JP)

(72) Inventor: Hidetaka Nambu, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/321,006

(22) Filed: Jul. 1, 2014

(65) Prior Publication Data

US 2014/0315388 A1 Oct. 23, 2014

Related U.S. Application Data

(63) Continuation of application No. 11/979,798, filed on Nov. 8, 2007, now abandoned.

(30) Foreign Application Priority Data

Nov. 16, 2006 (JP) .................................. 2006-310464

(51) Int. Cl.
| | |
|---|---|
| *H01L 21/4763* | (2006.01) |
| *H01L 21/308* | (2006.01) |
| *H01L 21/311* | (2006.01) |
| *H01L 21/768* | (2006.01) |

(52) U.S. Cl.
CPC ..... *H01L 21/3081* (2013.01); *H01L 21/31116* (2013.01); *H01L 21/31138* (2013.01); *H01L 21/76802* (2013.01)

(58) Field of Classification Search
None
See application file for complete search history.

(56) References Cited

U.S. PATENT DOCUMENTS

| | | |
|---|---|---|
| 5,087,591 A | 2/1992 | Teng |
| 6,168,726 B1 | 1/2001 | Li et al. |

(Continued)

FOREIGN PATENT DOCUMENTS

| | | |
|---|---|---|
| JP | 10-229122 | 8/1998 |
| JP | 2002-520853 A | 7/2002 |

(Continued)

OTHER PUBLICATIONS

U.S. Office Action in co-pending related U.S. Appl. No. 11/979,798 dated Apr. 1, 2010.

(Continued)

*Primary Examiner* — David E Graybill
(74) *Attorney, Agent, or Firm* — McGinn IP Law Group, PLLC

(57) ABSTRACT

A method of manufacturing a semiconductor device includes forming a second insulating layer over a first insulating layer, forming a mask over the second insulating layer, after the forming the mask, a first etching of the second insulating layer which is not covered by the mask, and after the first etching, a second etching of the second insulating layer and the first insulating layer which are not covered by the mask. At the first etching, the second insulating layer left over the first insulating layer and the first insulating layer is not exposed. At the second etching, the left over second insulating layer and the first insulating layer are etched. The first insulating layer has a lower dielectric constant than the second insulating layer. A second etching condition of the second etching includes a larger flow rate of oxygen than a first etching condition of the first etching.

20 Claims, 18 Drawing Sheets

(56) References Cited

U.S. PATENT DOCUMENTS

| | | |
|---|---|---|
| 6,211,092 B1 | 4/2001 | Tang et al. |
| 6,284,149 B1 | 9/2001 | Li et al. |
| 6,376,366 B1 | 4/2002 | Lin et al. |
| 6,380,096 B2 | 4/2002 | Hung et al. |
| 6,399,511 B2 | 6/2002 | Tang et al. |
| 6,451,688 B1 | 9/2002 | Shimpuku |
| 6,500,357 B1 | 12/2002 | Luo et al. |
| 6,734,089 B1 | 5/2004 | Hu et al. |
| 6,756,300 B1 | 6/2004 | Wang et al. |
| 6,797,630 B1 | 9/2004 | Wu et al. |
| 6,949,203 B2 | 9/2005 | Hsieh et al. |
| 7,307,025 B1 | 12/2007 | Worsham et al. |
| 7,387,961 B2 | 6/2008 | Tseng et al. |
| 7,465,673 B2 | 12/2008 | Igarashi et al. |
| 7,723,238 B2 | 5/2010 | Chiba |
| 7,910,489 B2 | 3/2011 | Kim et al. |
| 2001/0000246 A1 | 4/2001 | Tang et al. |
| 2001/0004552 A1 | 6/2001 | Tang et al. |
| 2001/0008226 A1 | 7/2001 | Hung et al. |
| 2002/0008323 A1 | 1/2002 | Watanabe et al. |
| 2002/0068442 A1 | 6/2002 | Shimpuku |
| 2002/0142598 A1 | 10/2002 | Tang et al. |
| 2004/0185380 A1 | 9/2004 | Igarashi et al. |
| 2004/0219796 A1 | 11/2004 | Wu |
| 2005/0001323 A1 | 1/2005 | Watanabe et al. |
| 2005/0101123 A1* | 5/2005 | Kumada ........... H01L 21/02118 438/637 |
| 2005/0269294 A1 | 12/2005 | Igarashi et al. |
| 2006/0170106 A1 | 8/2006 | Tseng et al. |
| 2006/0219174 A1 | 10/2006 | Nguyen et al. |
| 2007/0026677 A1 | 2/2007 | Ji et al. |
| 2007/0059938 A1 | 3/2007 | Kida et al. |
| 2007/0173062 A1* | 7/2007 | Andreas ................. C11D 7/08 438/689 |
| 2007/0190792 A1 | 8/2007 | Cook |
| 2007/0193973 A1 | 8/2007 | Kim et al. |
| 2008/0020570 A1 | 1/2008 | Naik |
| 2008/0119054 A1 | 5/2008 | Nambu |
| 2008/0121953 A1* | 5/2008 | Summerfelt ...... H01L 27/11502 257/295 |
| 2008/0166872 A1 | 7/2008 | Takigawa |
| 2009/0283773 A1* | 11/2009 | Yasumatsu .......... H01L 21/3003 257/72 |
| 2011/0272097 A1 | 11/2011 | Koshiishi et al. |
| 2012/0145324 A1 | 6/2012 | Koshiishi et al. |

FOREIGN PATENT DOCUMENTS

| | | |
|---|---|---|
| JP | 2003-332421 | 11/2003 |
| JP | 2004-71731 | 3/2004 |
| JP | 2005-353698 | 12/2005 |
| JP | 2006-032908 A | 2/2006 |

OTHER PUBLICATIONS

Chinese Office Action dated Feb. 5, 2010.

U.S. Office Action in co-pending related U.S. Appl. No. 11/979,798 dated Sep. 1, 2010.

Japanese Office Action dated May 8, 2012 with partial English Translation.

Chinese Office Action dated Jun. 5, 2012 with partial English Translation.

Chinese Office Action dated Dec. 4, 2012 with English Translation.

U.S. Office Action in co-pending related U.S. Appl. No. 11/979,798 dated Apr. 3, 2014.

* cited by examiner

FIG. 13A

Etch.Depth

| | | | | 371.0 | 371.5 | 374.0 | | | |
|---|---|---|---|---|---|---|---|---|---|
| | | 369.2 | 367.1 | 367.0 | 366.8 | 366.2 | 367.5 | 368.3 | |
| | 371.6 | 367.8 | 364.5 | 362.0 | 361.1 | 360.3 | 362.4 | 363.9 | 367.5 |
| 371.5 | 369.3 | 365.1 | 363.5 | 365.7 | 366.4 | 364.5 | 361.6 | 361.3 | 364.6 | 370.1 |
| 371.2 | 369.3 | 365.1 | 367.3 | 371.1 | 373.0 | 370.0 | 365.4 | 359.2 | 362.1 | 367.8 |
| 369.9 | 369.6 | 366.6 | 369.0 | 374.0 | 375.3 | 372.1 | 364.0 | 360.9 | 361.3 | 367.3 |
| 368.5 | 369.8 | 366.5 | 367.4 | 370.3 | 371.2 | 368.8 | 362.9 | 360.9 | 364.3 | 367.0 |
| 373.3 | 369.5 | 369.8 | 365.6 | 365.6 | 365.7 | 364.5 | 362.4 | 363.3 | 365.0 | 364.4 |
| | 369.1 | 367.3 | 368.8 | 367.7 | 366.0 | 365.2 | 365.0 | 367.7 | 364.9 | |
| | | | 369.4 | 367.8 | 368.4 | 366.8 | 366.3 | | | |

| item | Results |
|---|---|
| Average(nm) | 367.0 |
| $3\sigma$(nm) | 10.4 |
| Uniformity(+-%) | 2.2 |
| Max.-Min.(nm) | 16.1 |
| Max.(nm) | 375.3 |
| Min.(nm) | 359.2 |

| NGOF_Max | 0.99 |
|---|---|
| NGOF_Min | 0.99 |
| NGOF_Average | 0.99 |

FIG. 13B

Etch.Depth

| | | | | 363.3 | 366.3 | 366.9 | | | |
|---|---|---|---|---|---|---|---|---|---|
| | | 369.7 | 371.5 | 372.5 | 372.0 | 371.9 | 370.2 | 369.0 | |
| | 373.9 | 373.3 | 367.2 | 365.5 | 364.4 | 363.3 | 365.4 | 368.8 | 369.2 |
| 373.0 | 376.2 | 368.9 | 366.4 | 365.7 | 367.8 | 366.0 | 363.7 | 364.1 | 368.9 | 364.1 |
| 375.3 | 374.0 | 367.9 | 368.5 | 372.4 | 374.4 | 371.8 | 367.0 | 362.9 | 365.2 | 367.2 |
| 375.7 | 372.2 | 365.9 | 369.2 | 373.6 | 376.0 | 373.3 | 368.3 | 364.5 | 366.2 | 368.2 |
| 374.3 | 374.5 | 368.4 | 368.1 | 370.9 | 372.0 | 370.5 | 366.4 | 364.8 | 368.4 | 369.2 |
| 369.0 | 377.4 | 373.4 | 369.0 | 367.6 | 367.7 | 367.0 | 366.2 | 367.7 | 371.6 | 363.0 |
| | 370.8 | 376.1 | 376.3 | 372.4 | 370.7 | 370.9 | 372.0 | 373.7 | 366.5 | |
| | | | 372.6 | 374.3 | 376.7 | 374.8 | 369.2 | | | |

| item | Results |
|---|---|
| Average(nm) | 369.7 |
| $3\sigma$(nm) | 11.3 |
| Uniformity(+-%) | 2.0 |
| Max.-Min.(nm) | 14.6 |
| Max.(nm) | 377.4 |
| Min.(nm) | 362.9 |

| NGOF_Max | 0.99 |
|---|---|
| NGOF_Min | 0.99 |
| NGOF_Average | 0.99 |

FIG. 14A

Etch.Depth

|       |       |       |       | 393.7 | 390.7 | 391.2 |       |       |       |
|-------|-------|-------|-------|-------|-------|-------|-------|-------|-------|
|       |       | 389.6 | 379.4 | 372.1 | 369.3 | 370.0 | 375.3 | 383.6 |       |
|       | 388.1 | 374.6 | 367.7 | 361.5 | 360.5 | 359.3 | 362.1 | 368.1 | 380.7 |
| 393.9 | 377.8 | 367.1 | 362.2 | 363.2 | 365.2 | 363.4 | 363.8 | 361.9 | 370.0 | 385.0 |
| 386.9 | 374.5 | 365.8 | 366.0 | 369.5 | 371.5 | 368.3 | 365.7 | 360.5 | 365.1 | 379.5 |
| 387.0 | 374.2 | 364.9 | 367.5 | 371.7 | 372.8 | 371.2 | 366.3 | 362.8 | 365.2 | 378.9 |
| 389.6 | 376.6 | 367.1 | 365.5 | 369.0 | 370.2 | 368.5 | 364.7 | 363.1 | 371.3 | 382.8 |
| 403.0 | 385.8 | 372.0 | 366.5 | 365.6 | 364.9 | 364.6 | 364.9 | 368.5 | 377.6 | 391.9 |
|       | 397.1 | 383.1 | 375.5 | 371.2 | 369.3 | 370.0 | 373.7 | 379.4 | 391.3 |
|       |       | 391.3 | 384.2 | 381.6 | 382.0 | 386.9 |       |       |       |

| item            | Results |
|-----------------|---------|
| Average(nm)     | 374.1   |
| 3σ(nm)          | 30.7    |
| Uniformity(+-%) | 5.8     |
| Max.-Min.(nm)   | 43.7    |
| Max.(nm)        | 403.0   |
| Min.(nm)        | 359.3   |

| NGOF_Max     | 0.99 |
|--------------|------|
| NGOF_Min     | 0.97 |
| NGOF_Average | 0.99 |

FIG. 14B

Etch.Depth

|       |       |       |       | 382.8 | 383.9 | 383.9 |       |       |       |
|-------|-------|-------|-------|-------|-------|-------|-------|-------|-------|
|       |       | 383.4 | 380.2 | 375.4 | 371.6 | 372.4 | 377.3 | 383.5 |       |
|       | 382.6 | 375.2 | 368.2 | 363.3 | 361.7 | 362.5 | 365.2 | 371.9 | 382.6 |
| 383.7 | 376.3 | 366.8 | 364.0 | 363.6 | 364.5 | 363.7 | 361.2 | 362.3 | 372.1 | 385.2 |
| 382.9 | 371.4 | 363.5 | 363.8 | 368.7 | 371.0 | 369.2 | 364.0 | 362.2 | 367.2 | 379.9 |
| 383.2 | 371.5 | 364.1 | 364.4 | 369.4 | 372.2 | 370.0 | 365.0 | 361.1 | 367.0 | 379.8 |
| 384.6 | 374.4 | 365.7 | 364.0 | 365.8 | 368.0 | 366.1 | 363.1 | 362.5 | 370.2 | 383.5 |
| 382.7 | 382.5 | 371.3 | 365.4 | 363.7 | 363.4 | 363.1 | 363.9 | 367.9 | 378.4 | 390.9 |
|       | 385.8 | 383.1 | 375.4 | 370.3 | 368.8 | 369.9 | 373.1 | 380.1 | 389.7 |
|       |       | 389.0 | 384.3 | 382.3 | 384.2 | 388.6 |       |       |       |

| item            | Results |
|-----------------|---------|
| Average(nm)     | 372.8   |
| 3σ(nm)          | 25.9    |
| Uniformity(+-%) | 4.0     |
| Max.-Min.(nm)   | 29.8    |
| Max.(nm)        | 390.9   |
| Min.(nm)        | 361.1   |

| NGOF_Max     | 0.99 |
|--------------|------|
| NGOF_Min     | 0.98 |
| NGOF_Average | 0.99 |

METHOD OF MANUFACTURING SEMICONDUCTOR DEVICE

The present application is a Continuation Application of U.S. patent application Ser. No. 11/979,798, filed on Nov. 8, 2007, which is based on and claims priority from Japanese patent application No. 2006-310464, filed on Nov. 16, 2006, the entire contents of which are incorporated herein by reference.

BACKGROUND OF THE INVENTION

The present invention relates to a method of manufacturing a semiconductor device.

A dual damascene method that is a low-cost process of manufacture is used mainly when forming Cu wires on a device. The etch depth for wiring trench (film thickness of etching) directly relates to the cross-sectional area of Cu wires buried in subsequent processes and affects wiring resistance and/or capacitance. Accordingly, the etch uniformity and process stability of wiring trenches are especially important in a dual damascene method.

Japanese Patent Laid-Open No. 2003-332421 discloses a wire processing method using an etch stop layer. The problem of etch un-uniformity is solved by the use of an etch stop layer. However, this solution increases manufacturing costs since a process of forming the etch stop layer is added.

Japanese Patents Laid-Open Nos. 10-229122 and 2005-353698 disclose methods of etching insulating layers without using etch stop layers. In such methods of processing insulating layers as mentioned above, there arises a problem of etch un-uniformity originated from the instability of etching apparatus or from fluctuations in the ambient atmosphere within a chamber.

Japanese Patent Laid-Open No. 2004-71731 discloses an etching method not requiring the use of etch stop layers in a dual damascene method. In this method, a so-called low-k dielectric layer having relative permittivity lower than that of $SiO_2$ and an $SiO_2$ layer covering the dielectric layer (cap layer) are respectively etched under different conditions to form wiring trenches. Specifically, the $SiO_2$ layer is etched under the condition with a higher selection ratio for the low-k dielectric layer, and then the low-k dielectric layer is etched under the condition with a lower selection ratio for the low-k dielectric layer.

However, the method disclosed in Japanese Patent Laid-Open No. 2004-71731 has not been able to solve the problem of etch un-uniformity. The inventor of the present application has newly discovered that the cause of this is that the thickness of a deposition layer formed in the bottom of each trench significantly varies within a wafer during the etching of a second insulating layer, if the etching of the second insulating layer is stopped at a point where a first insulating layer is exposed when successively etching a laminated layer composed of the first insulating layer and the second insulating layer formed thereon. This irregularity of thickness degrades the uniformity of processing shape resulting from the processing of the first insulating layer.

SUMMARY

A method of manufacturing a semiconductor device having a first insulating layer and a second insulating layer provided thereon in accordance with the present invention includes:

a first etching step of etching the second insulating layer partway under first etching conditions; and a second etching step of etching the remnant of the second insulating layer left over in the first etching step and the first insulating layer under second etching conditions different from the first etching conditions.

In the manufacturing method described above, the etching of the second insulating layer is temporarily stopped partway, and then the remnant of the second insulating layer and the first insulating layer are etched collectively. By prohibiting the first insulating layer from being exposed immediately after the completion of the first etching step, as described above, it is possible to prevent a deposition layer having irregular thickness from being deposited. Accordingly, the uniformity of processing shape resulting from the processing of the first insulating layer improves.

BRIEF DESCRIPTION OF THE DRAWINGS

FIGS. 13A and 13B are wafer map to explain the advantages of the embodiments;

FIGS. 14A and 14B are wafer map to explain the advantages of the embodiments;

DETAILED DESCRIPTION OF THE PREFERRED EMBODIMENTS

Figure 1:
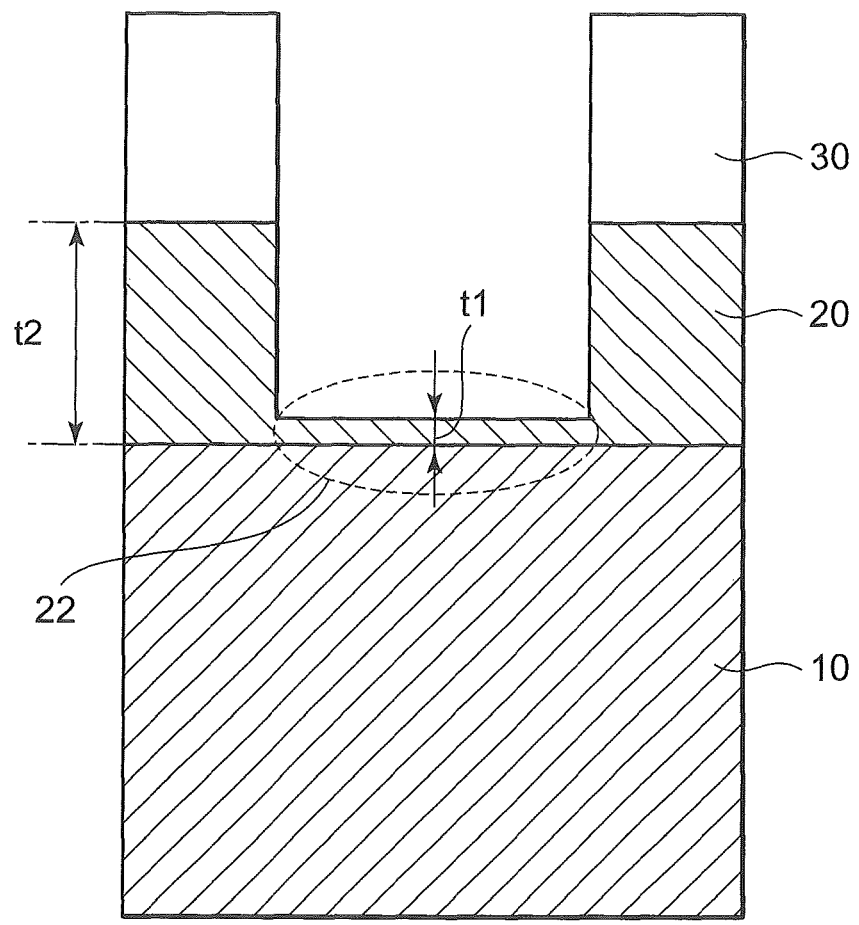
FIG. 1 is a process drawing illustrating one embodiment of a method of manufacturing a semiconductor device in accordance with the present invention.

Hereinafter, the preferred embodiments of a method of manufacturing a semiconductor device in accordance with the present invention will be described while referring to the accompanying drawings. Note that in the description of the drawings, same components are denoted by same reference numerals and will not be explained again.

Figure 2:
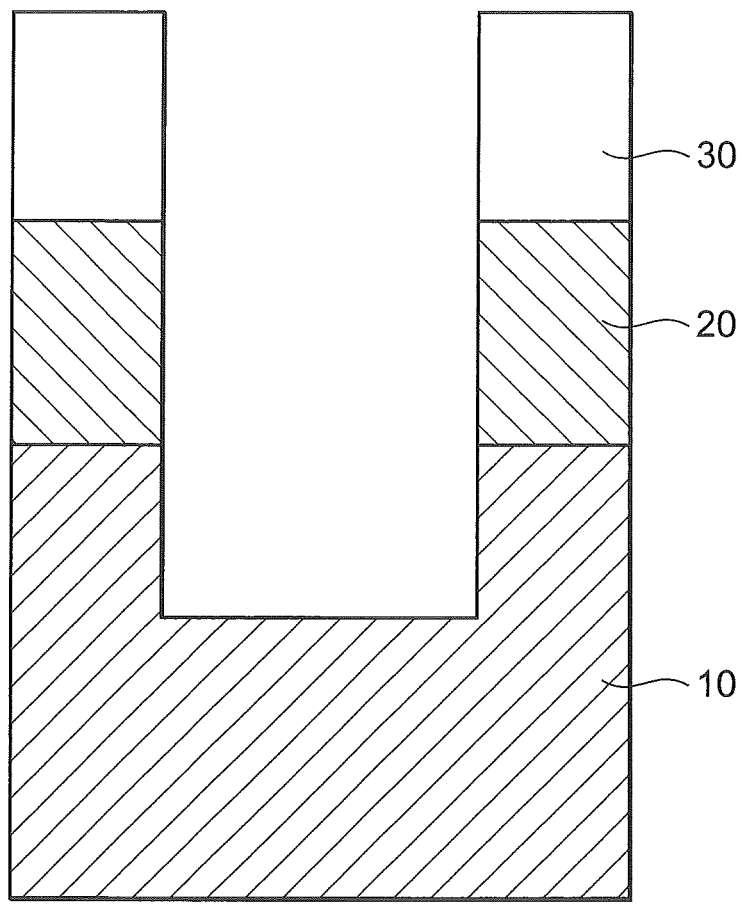
FIG. 2 is another process drawing illustrating one embodiment of a method of manufacturing the semiconductor device in accordance with the present invention.

FIGS. 1 and 2 are process drawings illustrating one embodiment of a method of manufacturing a semiconductor device in accordance with the present invention. This manufacturing method is intended to manufacture a semiconductor device having a low-k dielectric layer 10 (first insulating layer) and a cap layer 20 (second insulating layer) provided thereon. No etch stop layer is interposed between the low-k dielectric layer 10 and the cap layer 20.

The relative permittivity of the low-k dielectric layer 10 is preferably no greater than 3.5. As materials for composing the low-k dielectric layer 10, polyorganosiloxane, aromatic-containing organic material, hydrogen silsesquioxane (HSQ), spin-on glass (SOG) or flowable oxide (FOX: registered trademark), for example, may be used. As examples of polyorganosiloxane, there may be mentioned SiOC, methylsilsesquioxane (MSQ), methylated hydrogen silsesquioxane (MHSQ), and the like. Low-k dielectric layers made of SiOC include, for example, Black Diamond (registered trademark, hereinafter referred to as "BD") made by Applied Materials, Coral made by Novellus Systems Inc., and Aurola made by ASM International.

In addition, as examples of aromatic-containing organic material, there may be mentioned polyphenylene, polyarylether (PAE), divinylsiloxane-bis-benzocyclobutene, and the like. Low-k dielectric layers made of polyphenylene include, for example, SILK (registered trademark) made by Dow Chemical Company. Furthermore, low-k dielectric layers made of polyarylether include, for example, Flare made by Honeywell Electric Materials. Note that the low-k dielectric layer 10 may be in a porous state.

As materials for composing the cap layer 20, there may be mentioned SiO2, SiC, SiCN, SiN, benzocyclobutene (BCB), and the like.

First, the cap layer 20 is etched (first etching step) under the first etching conditions using resist 30 as a mask (FIG. 1) without exposing the low-k dielectric layer 10. The first etching conditions are preferably such conditions as are suited to the processing of the cap layer 20, i.e., conditions whereby the cap layer 20 can be processed with excellent etch uniformity. In addition, the etching time in the first etching step is preferably no shorter than 60% but no longer than 90% of the etching time (end point) required to etch the cap layer 20 to the last. The etching time required to etch the cap layer 20 to the last can be determined using, for example, an end point detector (EPD) system. This etching time corresponds to a period of time for which etching is carried out so that "t1" is no shorter than 10% but no longer than 40% of t2 when etching the "t2"-thick cap layer 20 as a remnant 22 to a thickness of "t1" in the first etching step.

Next, the remnant 22 of the cap layer 20 and the low-k dielectric layer 10 are etched using the second etching conditions different from the first etching conditions, without changing the etching conditions (second etching step) (FIG. 2). In the present embodiment, the first and second etching steps are carried out using an etching apparatus provided with upper and lower electrodes having mutually different high-frequency outputs. In addition, these etching steps are carried out as part of, for example, a dual damascene process. Note that the second etching step may be started either immediately or a predetermined length of time (stabilization time) later after the completion of the first etching step. The stabilization time is, for example, approximately 3 seconds.

The second etching conditions are preferably such conditions that the second etching condition prohibits a selection ratio being applied between the low-k dielectric layer 10 and the cap layer 20. In addition, the flow rate of oxygen is preferably higher under the second etching conditions than under the first etching conditions. The mixing ratio of oxygen in the second etching conditions is preferably no lower than 0.4% but no higher than 2.6%. Furthermore, the high-frequency output (hereinafter referred to as the "top power") of the upper electrode is preferably higher under the second etching conditions than under the first etching conditions. The top power under the second etching conditions is preferably no lower than 1300 W but no higher than 2200 W.

A preferred example of the first etching conditions is as follows:
A gas consisting primarily of CH4-nFn ("n" is a natural number equal to or smaller than 4) is used with a pressure being no lower than 30 mTorr but no higher than 60 mTorr, the top power being no lower than 200 W but no higher than 600 W, the bias output being no lower than 700 W but no higher than 1300 W, and the flow rate of argon (Ar) being no lower than 0.9 l/min (900 sccm) but no higher than 1.8 l/min (1800 sccm).

On the other hand, a preferred example of the second etching conditions is as follows:
A gas consisting primarily of CH4-nFn ("n" is a natural number equal to or smaller than 4) is used with a pressure being no lower than 30 mTorr but no higher than 60 mTorr, the top power being no lower than 1300 W but no higher than 2200 W, the bias output being no lower than 600 W but no higher than 1200 W, and the flow rate of argon (Ar) being no lower than 0.2 l/min (200 sccm) but no higher than 0.6 l/min (600 sccm).

Note that in some cases, the gas flow rate may be higher (for example, 9:1 in terms of a partial pressure ratio) in the vicinity of the central part of a wafer than in the vicinity of the edge part thereof. In that case, gas flow rates exemplified in the present specification refer to those in the vicinity of the central part of a wafer.

Now, the advantages of the present embodiment will be described. In the present embodiment, the etching of the cap layer 20 is temporarily stopped halfway, and then the remnant 22 of the cap layer 20 and the low-k dielectric layer 10 are etched under different etching conditions. By prohibiting the low-k dielectric layer 10 from being exposed immediately after the completion of the first etching step, as described above, it is possible to prevent a deposition layer having irregular thickness from being deposited. Accordingly, the uniformity of processing shape resulting from the processing of the low-k dielectric layer 10 improves.

In contrast, according to the method disclosed in Tokukai 2004-71731, the uniformity of processing shape resulting from the processing of the first insulating layer degrades, as described above. Now, a specific example of this problem will be described. In general, etching proceeds according to competitive reaction between depositions accumulating on a wafer and ions plunging into the wafer. At this time, the speed at which the depositions accumulate and the uniformity of the depositions differ depending on the type thereof. In addition, there is a difference in etching characteristics between an $SiO_2$ layer and a low-k dielectric layer. For example, the $SiO_2$ layer has difficulties in facilitating etching in the absence of a physical sputtering element, while the low-k dielectric layer containing carbon and hydrogen is easy to be etched by not a physical etching but a chemical etching.

Figure 15:
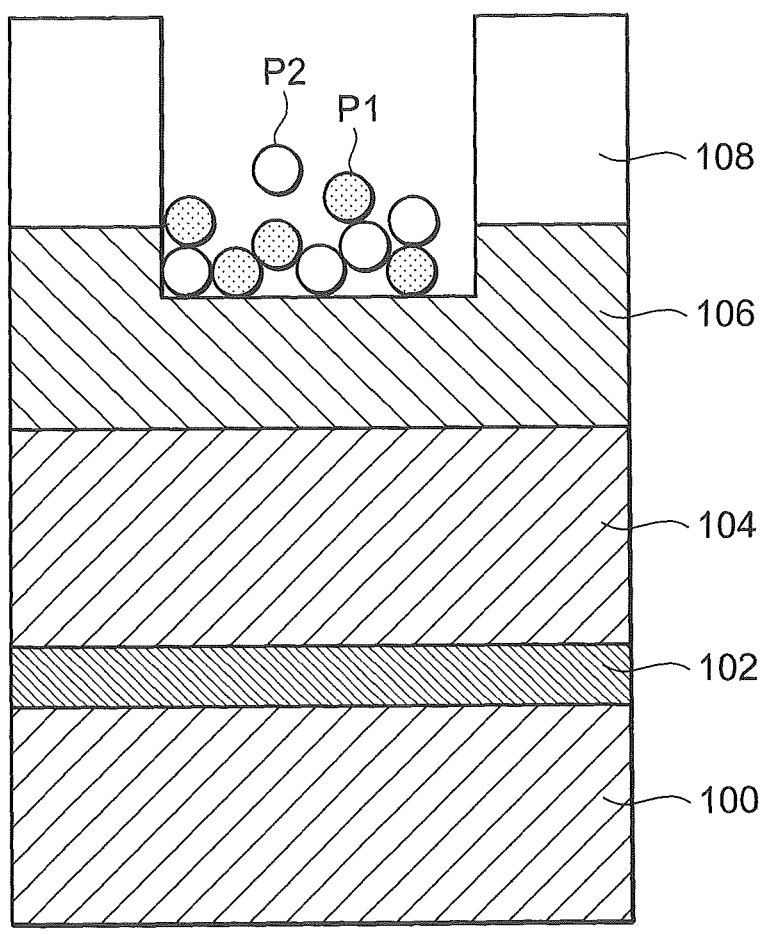
FIG. 15 is a cross-sectional view intended to explain problems with a related art.
Figure 16A:
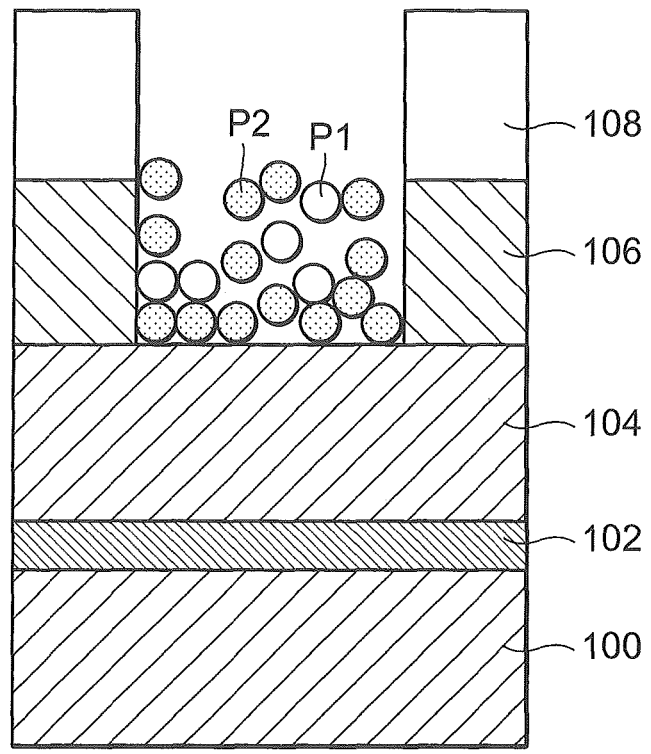
FIGS. 16A and 16B are cross-sectional views intended to explain problems with a related art.
Figure 16B:
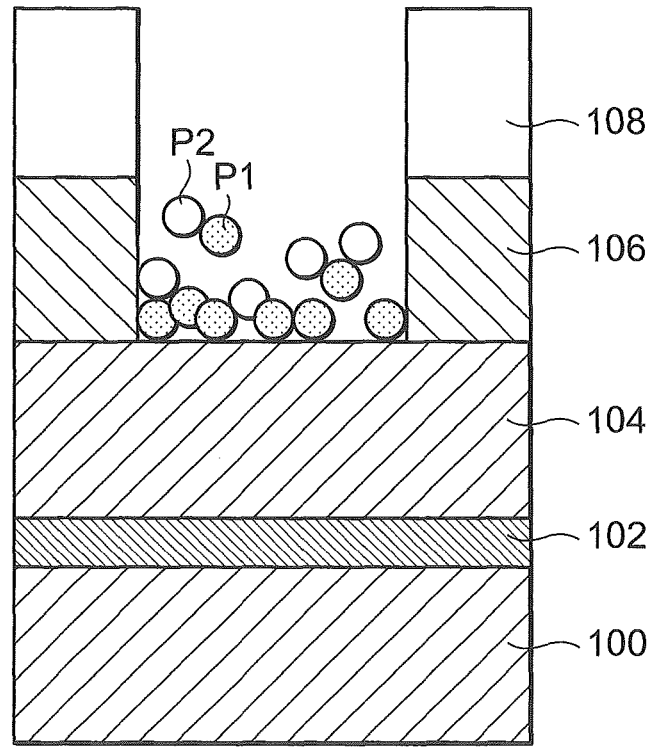

Accordingly, as shown in FIG. 15, excellent uniformity is maintained within the wafer in terms of the amount of depositions during the etching of the $SiO_2$ layer 106, since a balance is reached between depositions P1 accumulating in a trench and ions P2 plunging into the trench. However, the balance of depositions accumulating on the low-k dielectric layer 104 disrupts due to a difference in deposition constituents produced from the low-k dielectric layer 104, such as carbon and hydrogen, and due to a difference in the probability of adherence of the depositions to the low-k dielectric layer 104, as soon as the low-k dielectric layer 104 is exposed. FIGS. 16A and 16B respectively show conditions in the vicinity of the central and edge parts of the wafer at this point. In these figures, a via stop layer 102, the low-k dielectric layer 104, the cap layer 106 and resist 108 are stacked sequentially in this order on an interlayer insulating layer 100. In the interlayer insulating layer 100, there are formed elements, such as transistors, and wires (both are not shown in the figure).

Figure 17A:
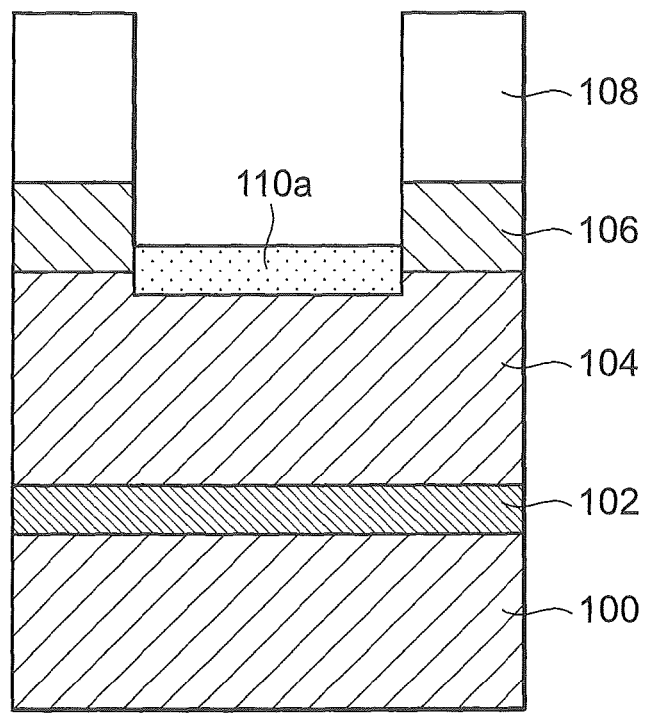
FIGS. 17A and 17B are cross-sectional views intended to explain problems with a related art.
Figure 17B:
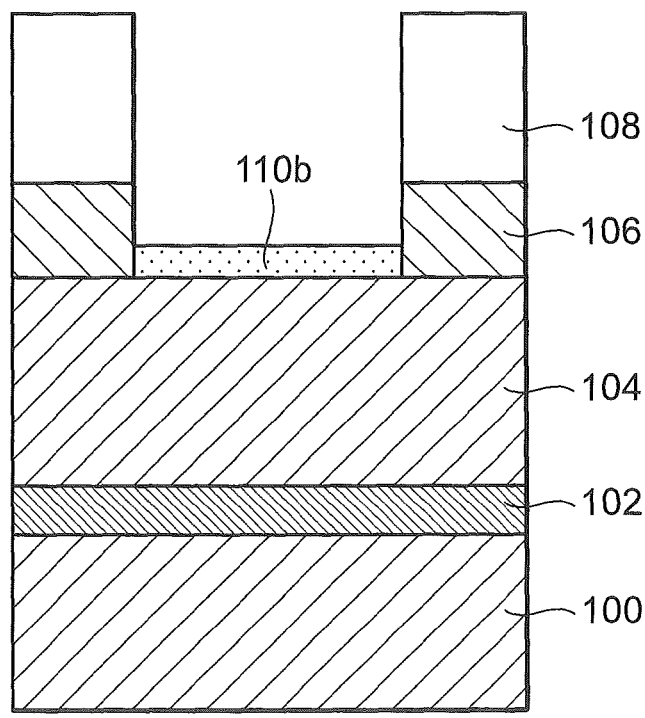
Figure 18A:
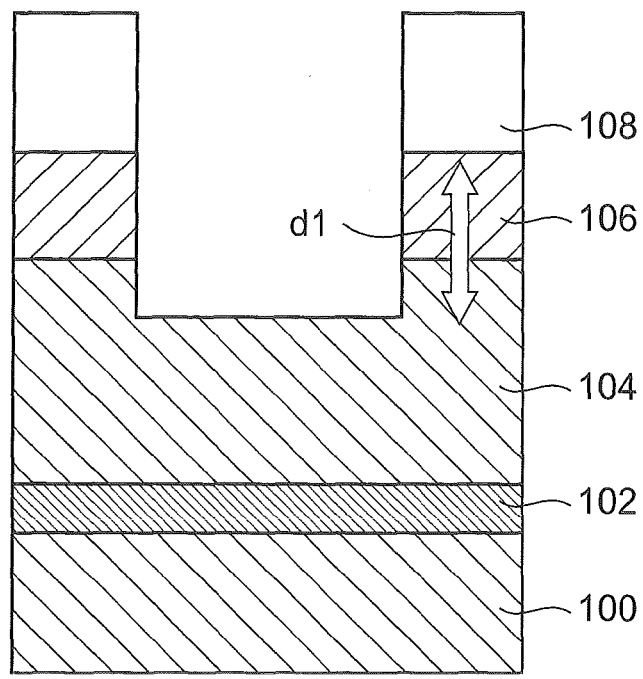
FIGS. 18A and 18B are cross-sectional views intended to explain problems with a related art.
Figure 18B:
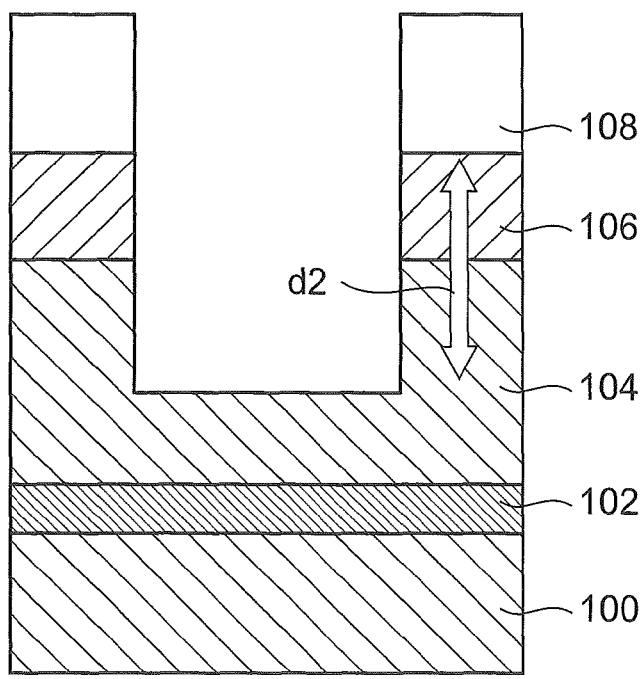

Consequently, as shown in FIGS. 17A and 17B, deposition layer 110a near the central part of the wafer is thicker than a deposition layer 110b near the edge part of the wafer. As a result, as shown in FIGS. 18A and 18B, an etch depth "d1" near the central part of the wafer is smaller than an etch depth d2 near the edge part of the wafer when etching the low-k dielectric layer 104. In this way, the uniformity of etch depth and the like within the wafer becomes impaired due to a difference in the thickness of deposition layers. In contrast, according to the present embodiment, a high degree of uniformity of etch depth can be obtained within wafer.

In addition, if a deposition layer accumulates on the low-k dielectric layer 10, the throughput decreases and the manufacture efficiency is lowered since an extra amount of time is consumed in order to remove the deposition layer. According to the present embodiment, it is possible to also avoid these problems.

Incidentally, when forming the cap layer 20 on the low-k dielectric layer 10, there may be a case that a transmuted layer is produced between these layers. This transmuted layer is, for example, a layer composed of an SiON-like material. A possible cause for the transmuted layer being formed is that a raw material gas for the cap layer 20 triggers unwanted reactions when the cap layer is formed using a CVD method. Unfortunately, the presence of this transmuted layer can also be a cause for the impairment of etch uniformity within wafer, like the deposition layers. This is because the transmuted layer is thicker near the central part of the wafer than near the edge part thereof. In contrast, according to the present embodiment, it is possible to adequately suppress the effects of the transmuted layer even if such a transmuted layer exists, by setting the second etching conditions so that a selection ratio with respect to the transmuted layer also decreases. Accordingly, it is possible to alleviate etch non-uniformity attributable to the transmuted layer.

In the present embodiment, there is further provided the cap layer 20 on the low-k dielectric layer 10. Consequently, it is possible to prevent the low-k dielectric layer 10 from not only suffering damage but also absorbing moisture at the time of chemical mechanical polishing (CMP).

Furthermore, there is no etch stop layer interposed between the low-k dielectric layer 10 and the cap layer 20. Accordingly, it is possible to reduce the cost of manufacturing a semiconductor device. In contrast, if an etch stop layer is provided as in the case of the semiconductor device described in Tokukai 2003-332421, the frequency of film-forming increases by as much as the number of additional steps of forming the etch stop layer and then forming an interlayer insulating layer thereon, thus resulting in an increase in the manufacturing costs.

In cases where an etching time in the first etching step is no shorter than 60% but no longer than 90% of an end point time, it is possible to improve etch uniformity within wafer.

In this regard, FIGS. 3 to 5 show the results of tests performed to examine a relationship between the etching time and the irregularity of etch depth. In the tests mentioned above, an $SiO_2$ layer was used as the cap layer 20. In addition, the first etching conditions, i.e., the etching conditions of the $SiO_2$ layer were set so that the pressure was 40 mTorr, the top power was 300 W, the bias output was 1000 W, the flow rate of CHF3 was 0.035l/min(35 sccm), the flow rate of CF4 was 0.055l/min (55 sccm), and the flow rate of Ar was 0.9l/min (900 sccm).

Figure 3A:
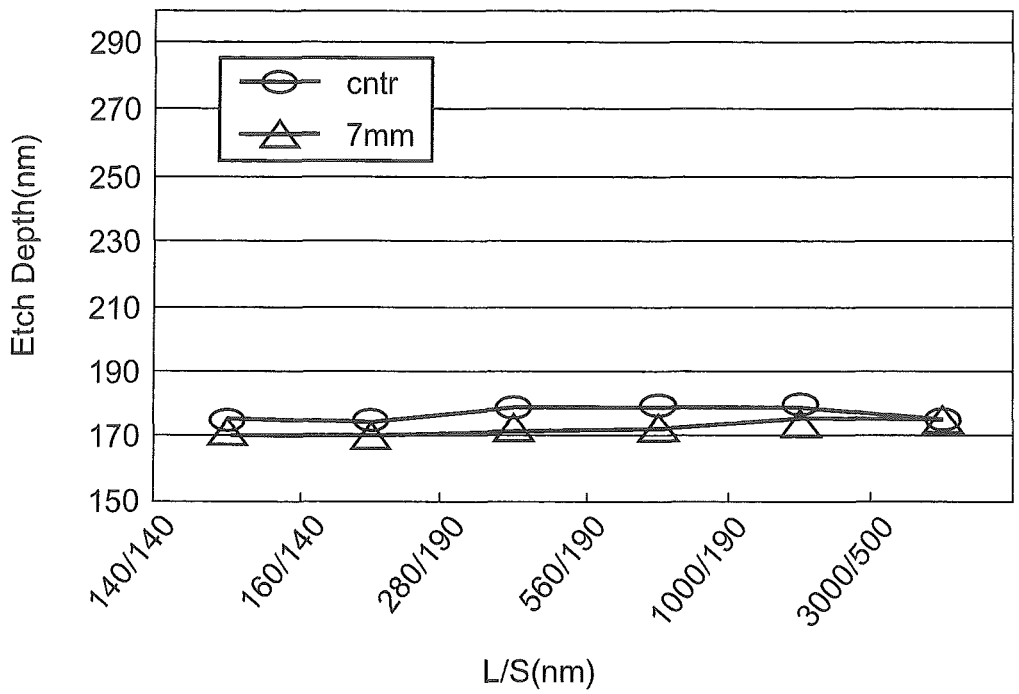
FIGS. 3A and 3B are graphs intended to explain the advantages of the embodiments.
Figure 3B:
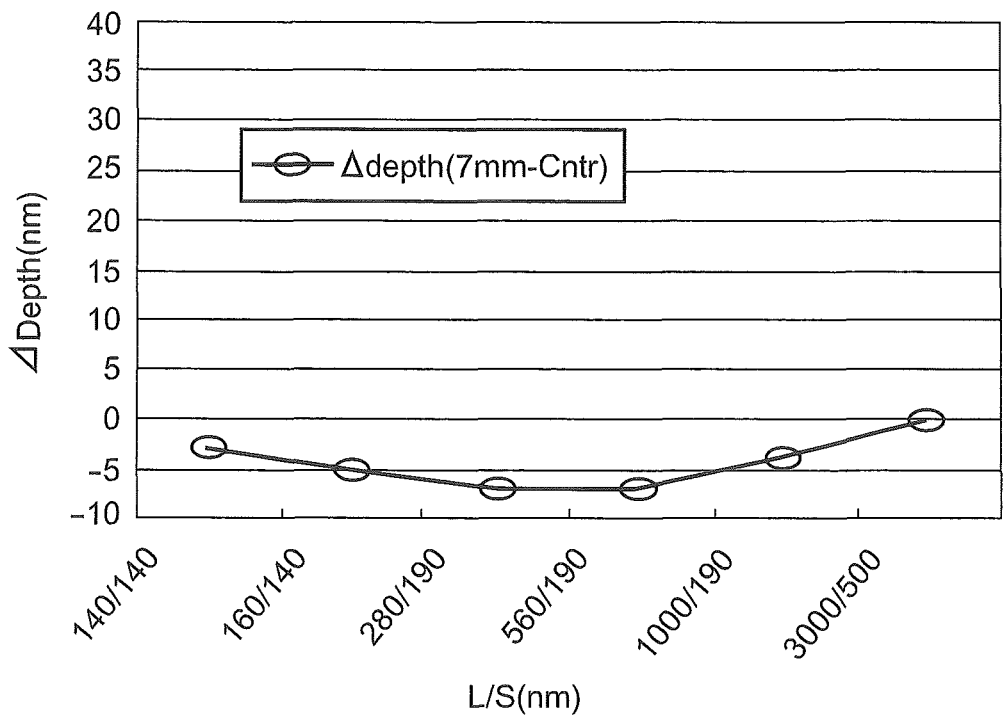

FIGS. 3A and 3B are graphs showing test results when the etching time was specified as 70% of the end point time. The horizontal axes of these graphs represent the dimensions of a pattern of lines and spaces, i.e., line width (nm)/space width (nm). In addition, the vertical axes represent etch depth (nm) in FIG. 3A and a difference in the etch depth (nm) in FIG. 3B. The etch depths were measured at points 7 mm away from the central part (cntr) and from the edge part of the wafer, respectively. The etch depth was defined as a value obtained by subtracting the former measured value from the latter measured value.

Figure 4A:
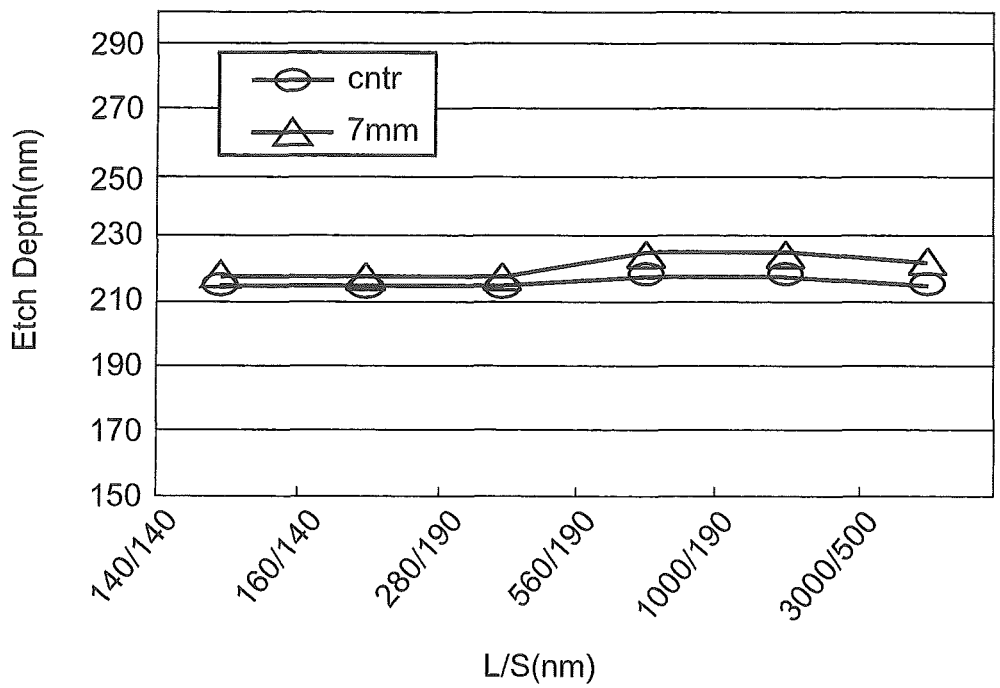
FIGS. 4A and 4B are graphs intended to explain the advantages of the embodiments.
Figure 4B:
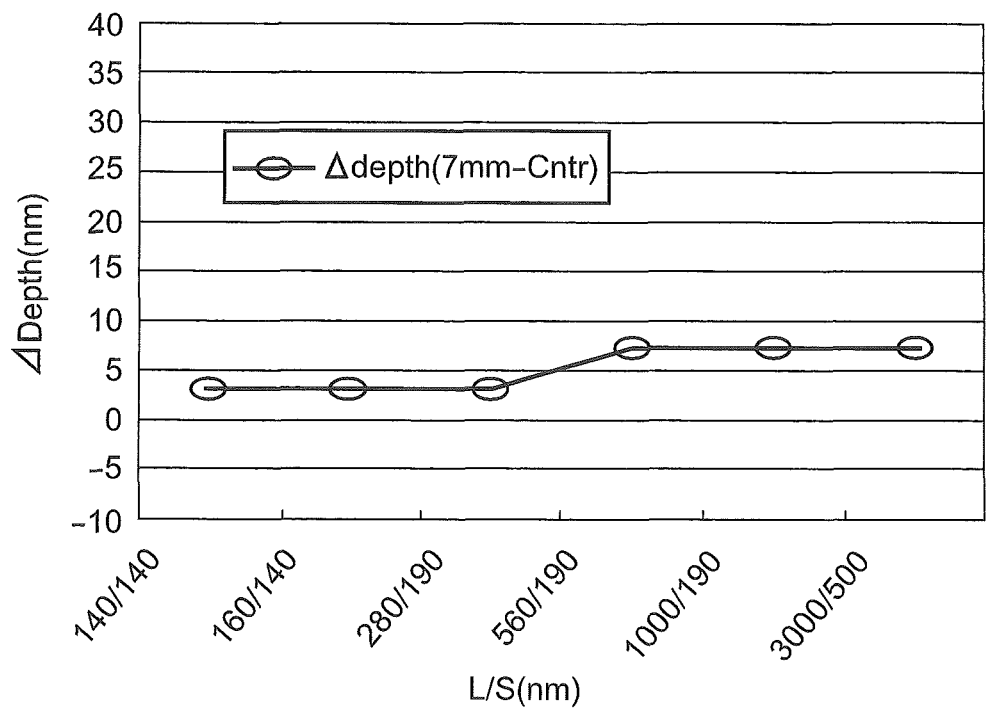
Figure 5A:
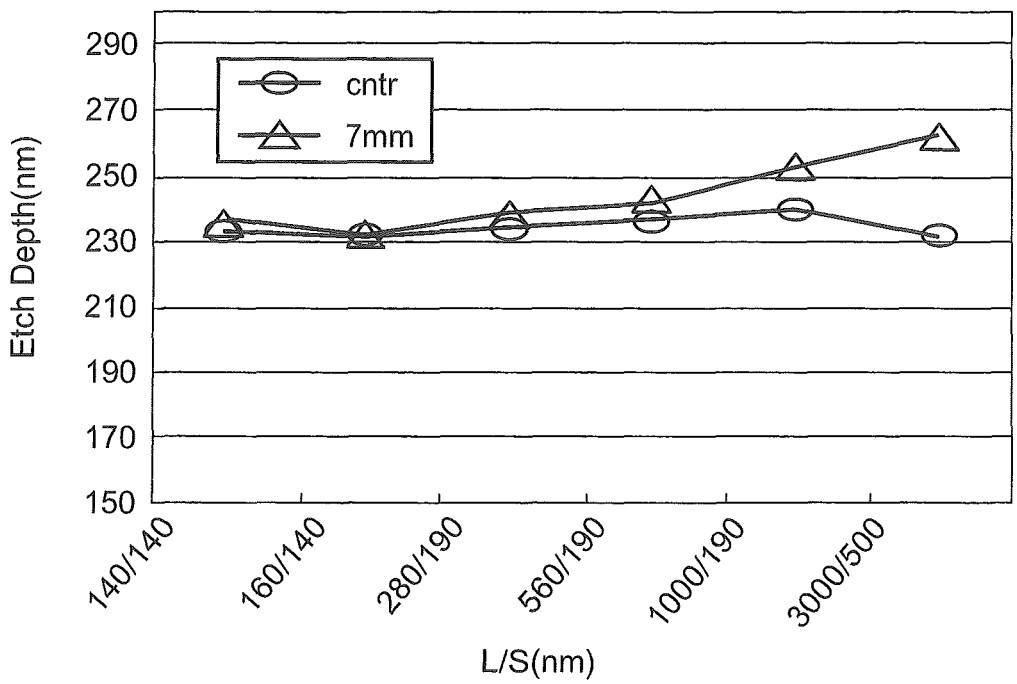
FIGS. 5A and 5B are graphs intended to explain the advantages of the embodiments.
Figure 5B:
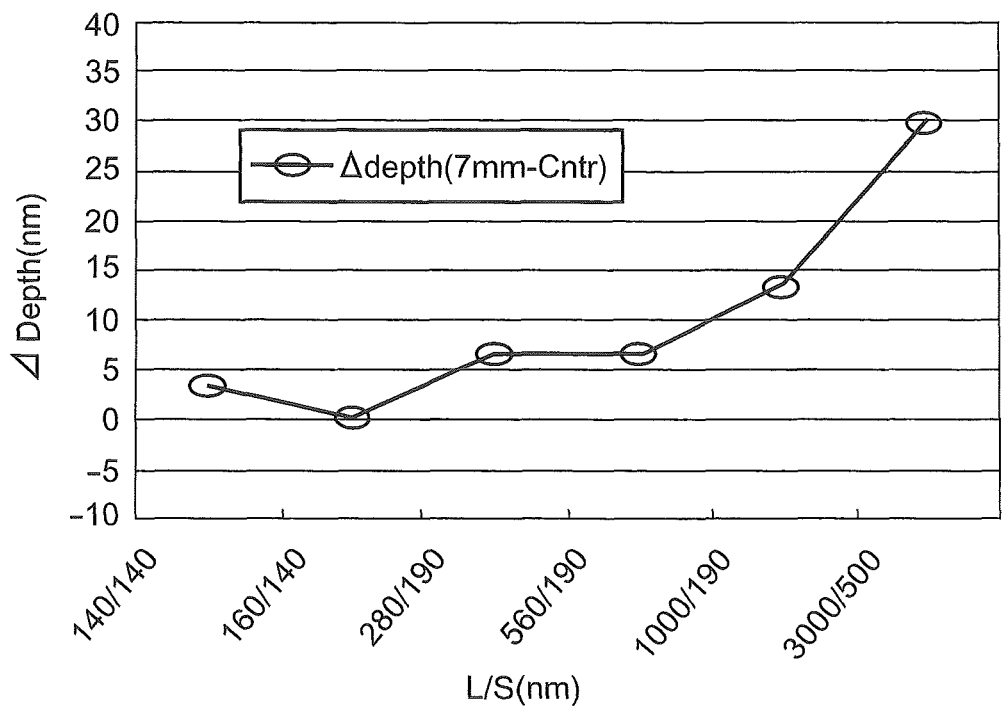

FIGS. 4A and 4B show test results when the etching time was specified as 85% of the end point time, whereas FIGS. 5A and 5B show test results when the etching time was specified as 95% of the end point time. The meanings of the graphs shown in FIGS. 4A and 5A are the same as those of the graph shown in FIG. 3A. Likewise, the meanings of the graphs shown in FIGS. 4B and 5B are the same as those of the graph shown in FIG. 3B.

Comparison between these graphs reveals that the irregularity of etch depth is smaller when the etching time is within the above-described range (see FIG. 3 or FIG. 4) than when the etching time is out of the above-described range (no shorter than 60% but no longer than 90% of the end point time) (see FIG. 5).

Figure 6A:
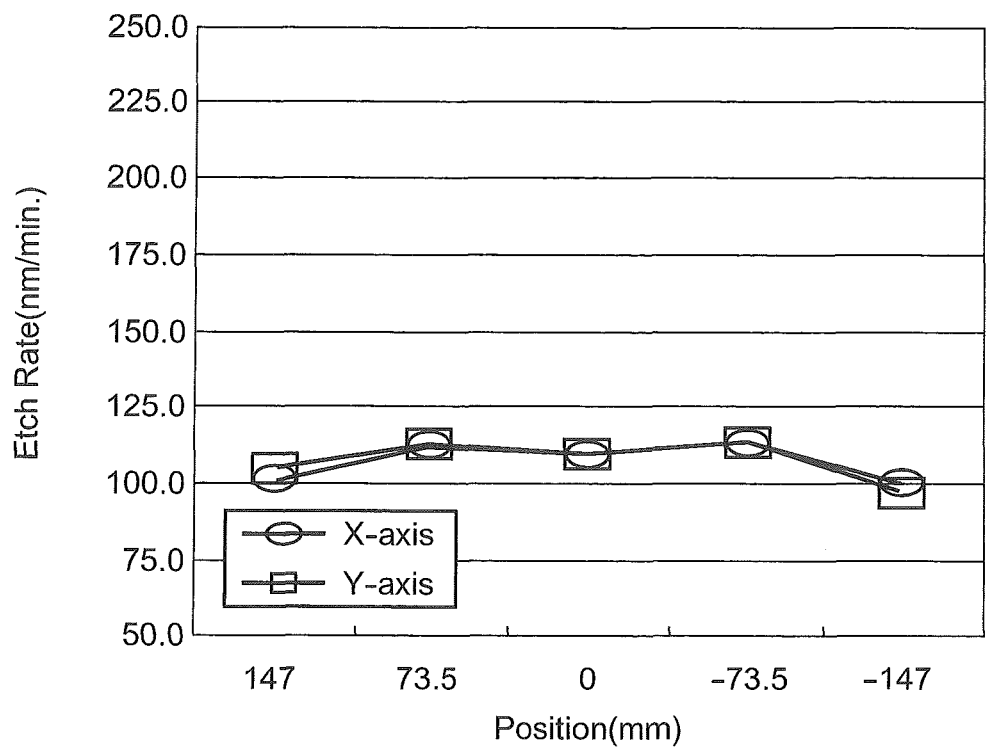
FIGS. 6A and 6B are graphs intended to explain the advantages of the embodiments.
Figure 6B:
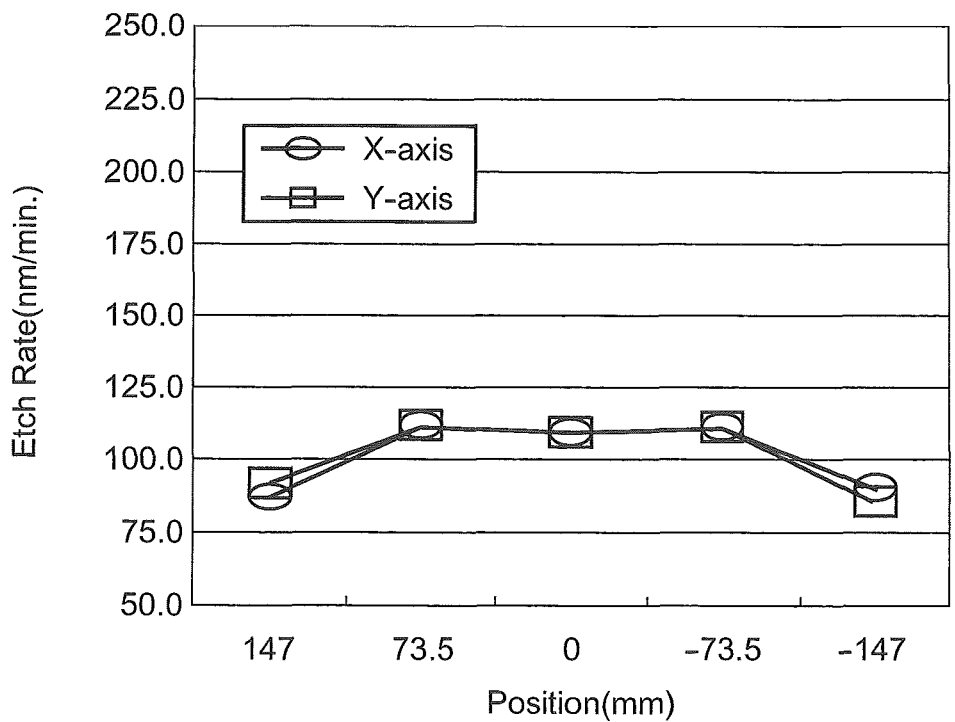
Figure 7A:
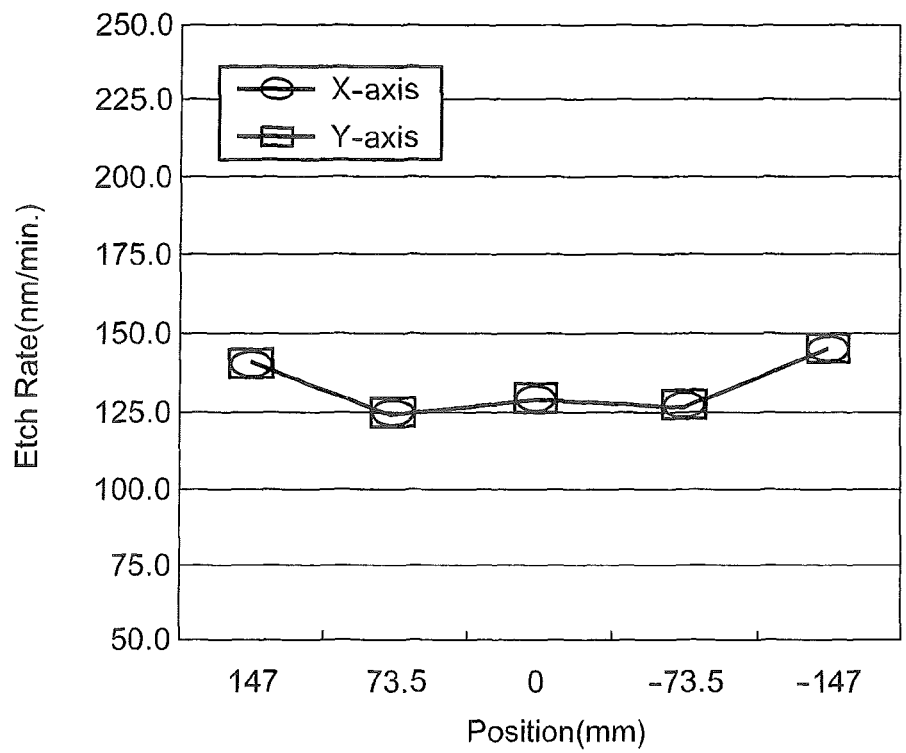
FIGS. 7A and 7B are graphs intended to explain the advantages of the embodiments.
Figure 7B:
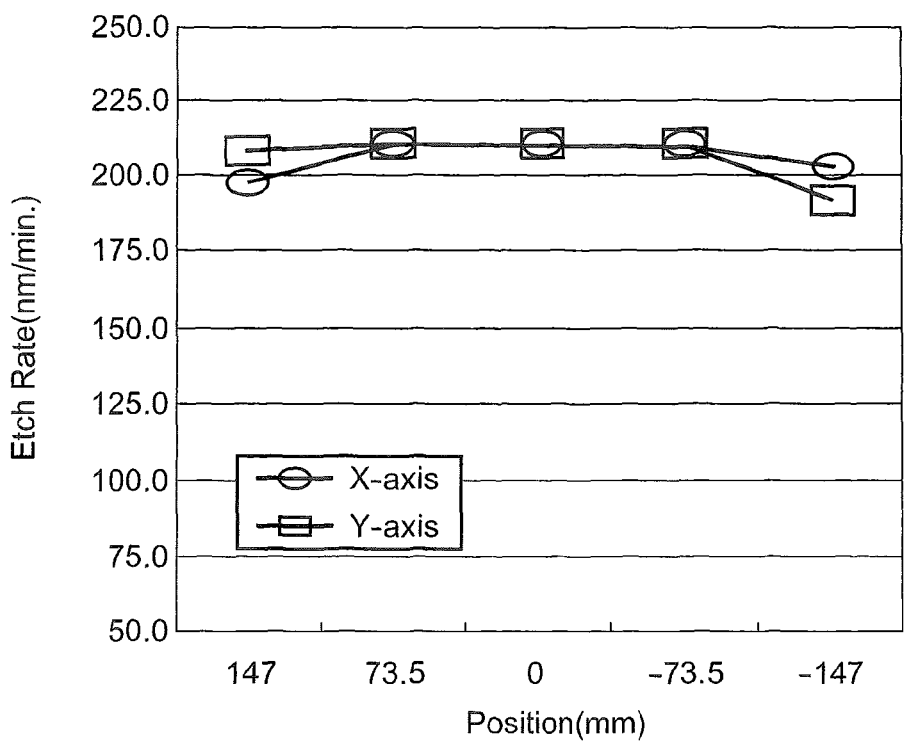

FIGS. 6A and 6B are graphs showing the results of measuring the etch rate profiles of an $SiO_2$ layer within wafer in cases where the present embodiment was applied. In contrast, FIGS. 7A and 7B are graphs showing the results of measuring the etch rate profiles of the $SiO_2$ layer within wafer in cases where the present embodiment was not applied. The horizontal axes of these graphs represent a position (mm) measured with the center of the wafer defined as the point of origin, whereas the vertical axes represent an etch rate (nm/min). In addition, the X-axis denotes a horizontal direction when the notch of the wafer is faced downwardly and the Y-axis denotes a direction perpendicular to that direction, i.e., a vertical direction. FIGS. 6A and 7A show the results of measurement after parts in the chamber of the etching apparatus wore out, whereas FIGS. 6B and 7B show the results of measurement when the parts were new.

Comparison between these graphs reveals that an etch rate profile varies according to the degree of wear of parts in cases where the present embodiment was not applied (see FIG. 7), whereas the etch rate profile does not depend on the degree of wear of parts in cases where the present embodiment was applied (see FIG. 6). As described above, the manufacturing method in accordance with the present embodiment is superior in long-term stability.

In cases where the mixing ratio of oxygen in the second etching conditions is no lower than 0.4%, it is possible to improve etch uniformity within wafer. Furthermore, in cases where the mixing ratio of oxygen is no higher than 2.6%, it is possible to secure a sufficiently high selection ratio with respect to the resist 30 and control the degree of roughness to a minimum.

Figure 8A:
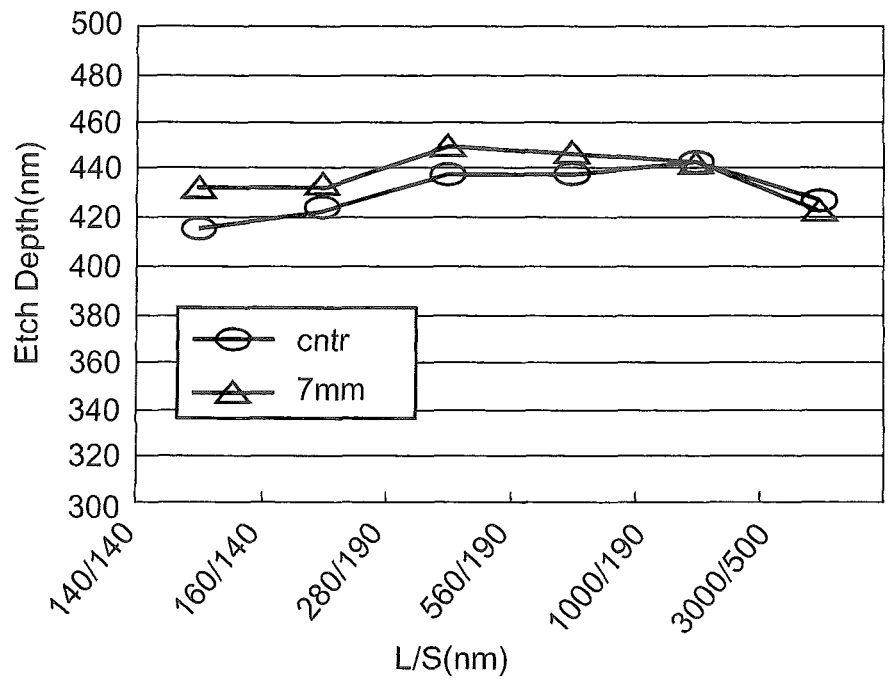
FIGS. 8A and 8B are graphs intended to explain the advantages of the embodiments.
Figure 8B:
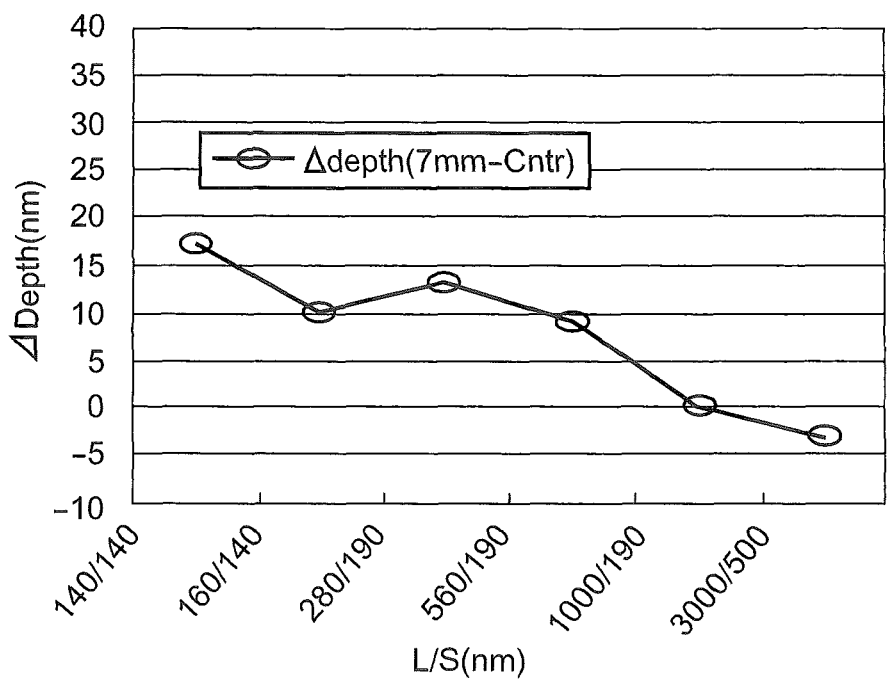
Figure 9A:
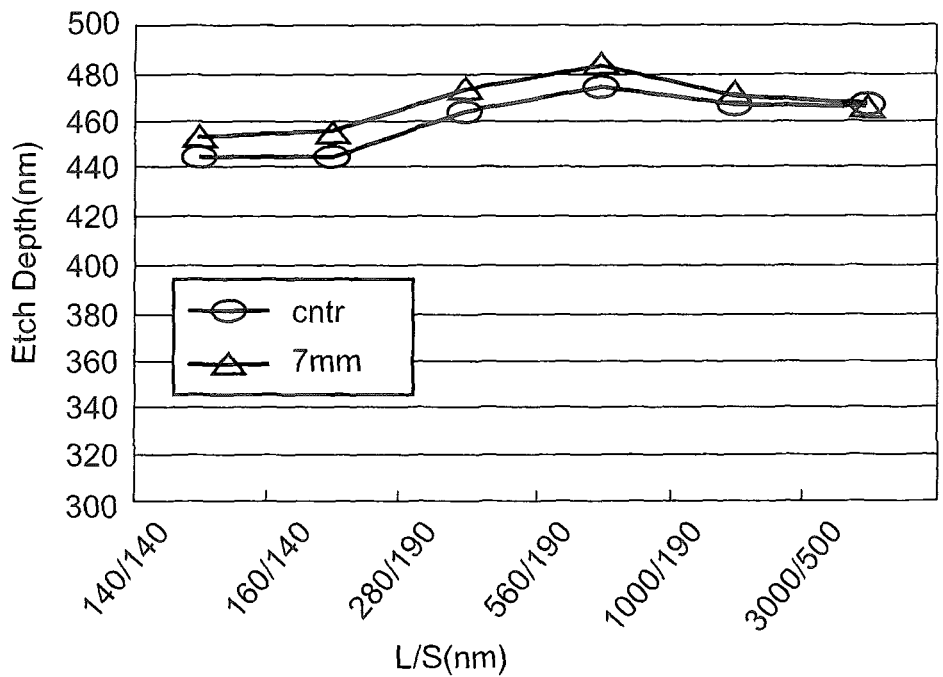
FIGS. 9A and 9B are graphs intended to explain the advantages of the embodiments.
Figure 9B:
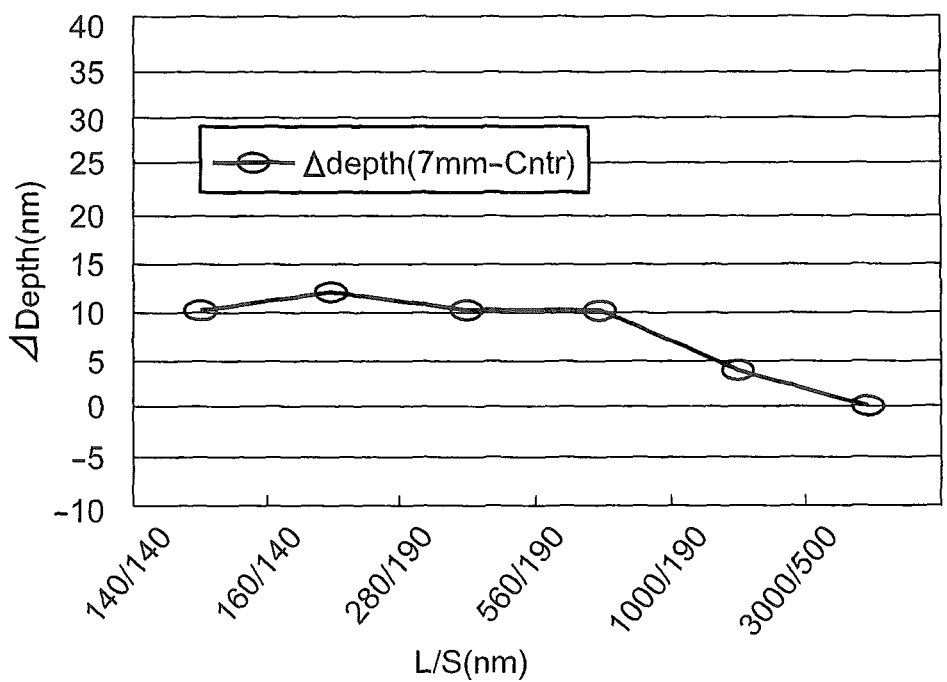

In this regard, FIGS. 8 and 9 show the results of tests performed to examine a relationship between the mixed amount of oxygen and the irregularity of etch depth in the second etching step. In the tests mentioned above, BD was used as the low-k dielectric layer 10. In addition, the second etching conditions were set so that the pressure was 40 mTorr, the top power was 1900 W, the bias output was 600 W, the flow rate of CHF3 was 0.023 l/min (23 sccm), the flow rate of CF4 was 0.023 l/min (23 sccm), and the flow rate of Ar is 0.4 l/min (400 sccm). In this case, the condition of the mixing ratio of oxygen being no lower than 0.4% but no higher than 2.6% corresponds to the condition of the flow rate of $O_2$ being no lower than 0.002 l/min (2 sccm) but no higher than 0.012 l/min (12 sccm). In FIGS. 8 and 9, the flow rates of $O_2$ were respectively set to 0.003 l/min (3 sccm) and 0.006 l/min (6 sccm). Other conditions are as described with regard to FIGS. 3 to 5. The meanings of the graphs shown in FIGS. 8A and 9A are the same as those of the graph shown in FIG. 3A. Likewise, the meanings of the graphs shown in FIGS. 8B and 9B are the same as those of the graph shown in FIG. 3B.

Comparison between these graphs reveals that the etch rate increases mainly in the vicinity of the central part of the wafer as the mixed amount of $O_2$ increases, thus resulting in a decrease in the irregularity of etch depth. A possible cause for this is that $O_2$ has the capability to decrease the amount of the depositions described earlier.

Figure 10A:
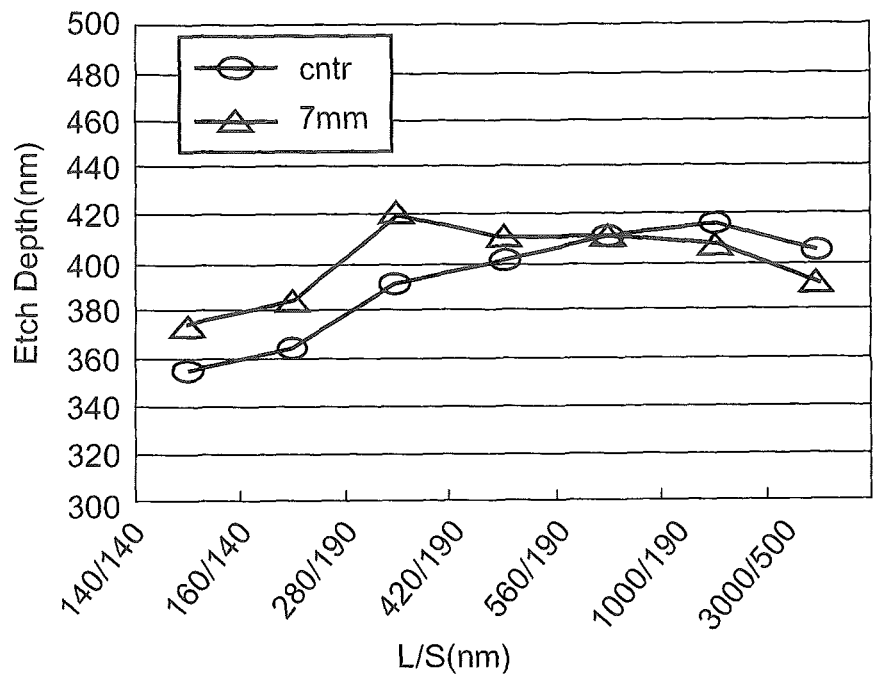
FIGS. 10A and 10B are graphs intended to explain the advantages of the embodiment.
Figure 10B:
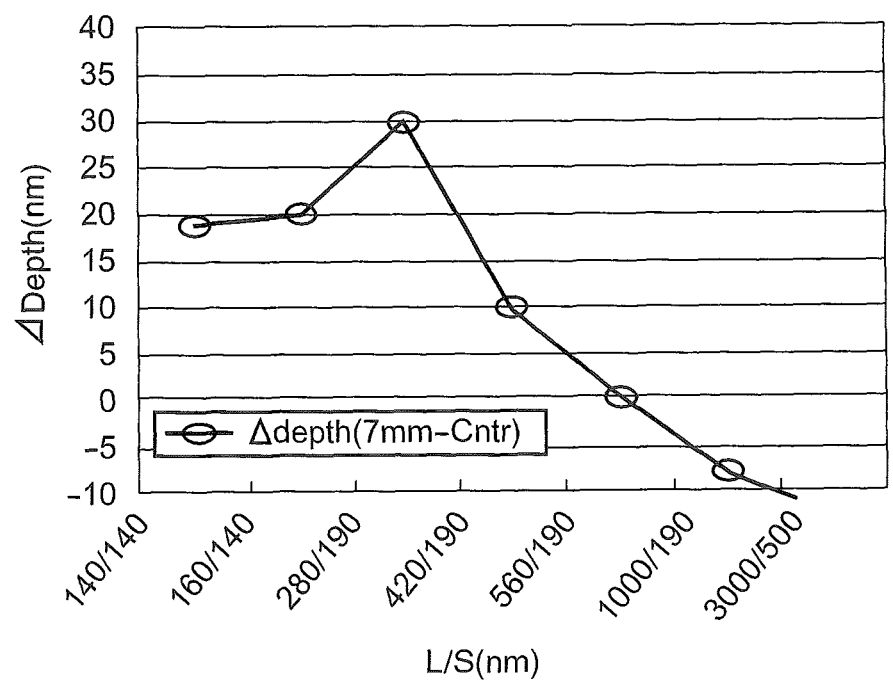
Figure 11A:
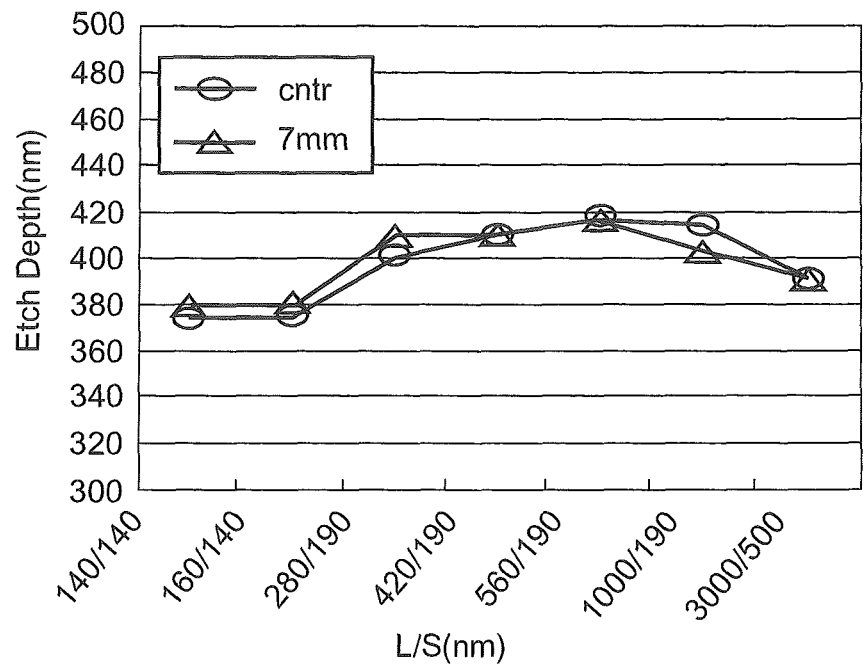
FIGS. 11A and 11B are graphs intended to explain the advantages of the embodiments.
Figure 11B:
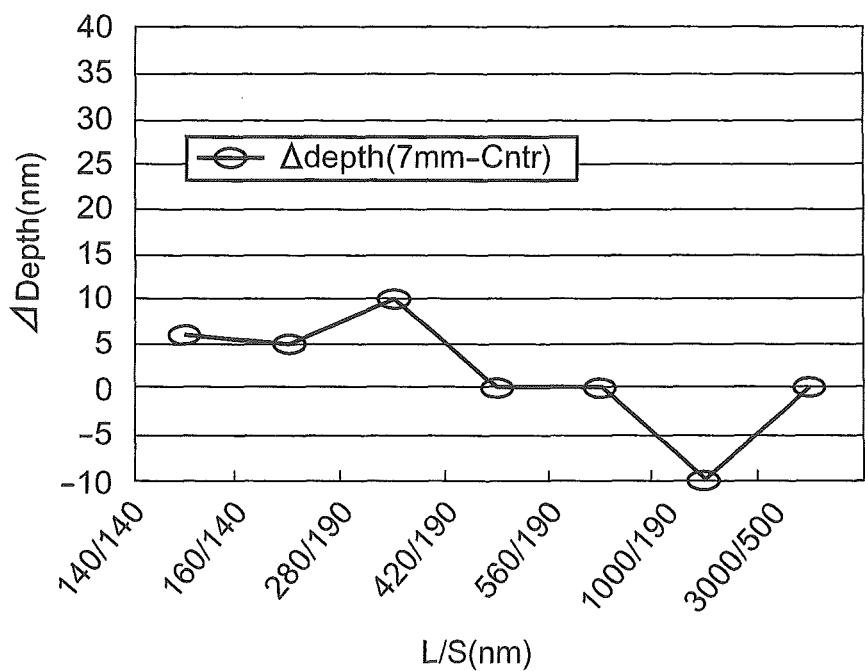
Figure 12A:
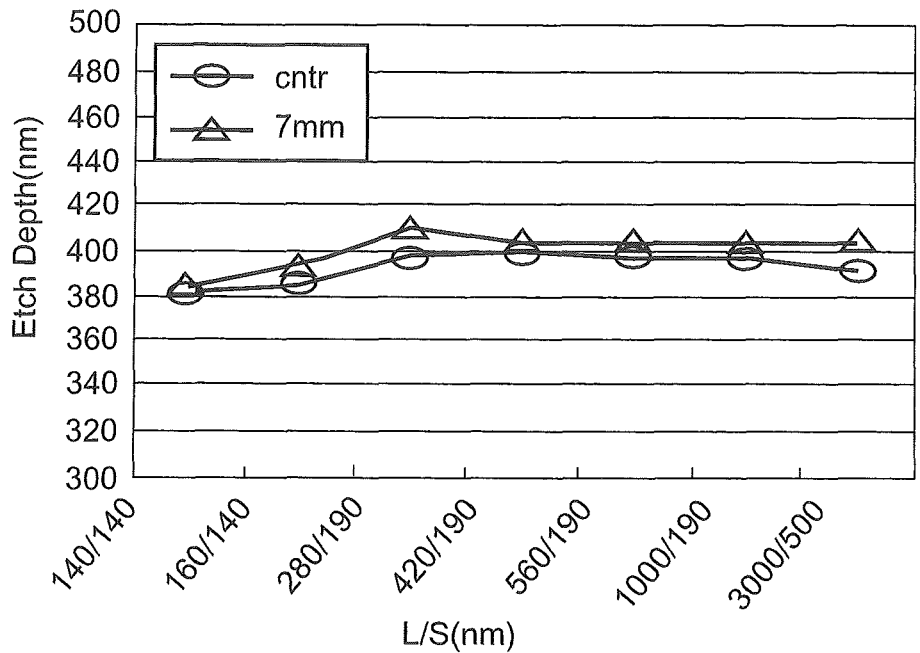
FIGS. 12A and 12B are graphs intended to explain the advantages of the embodiments.
Figure 12B:
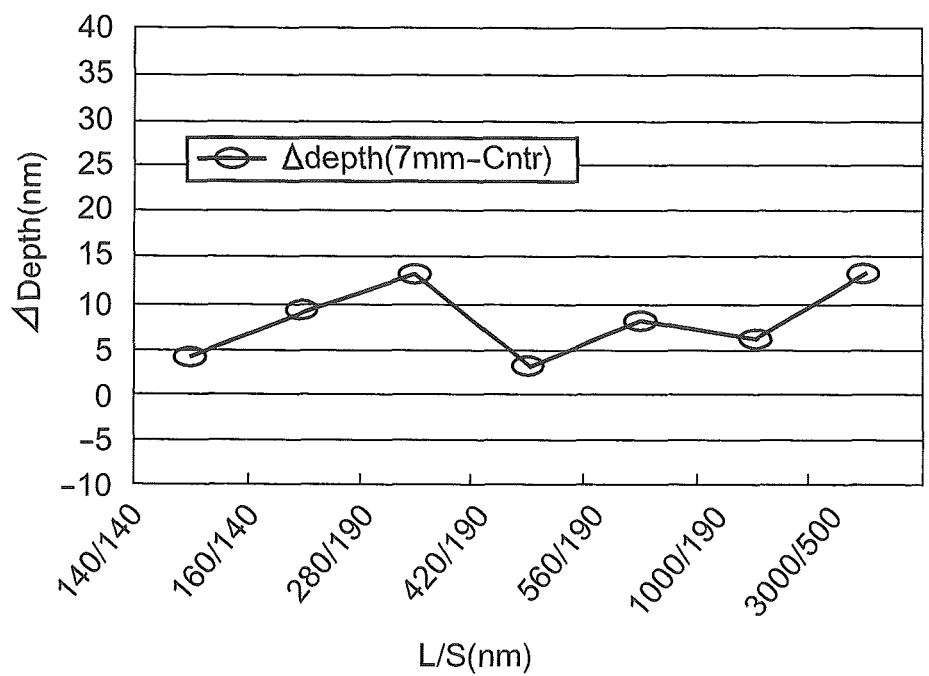

In cases where the top power in the second etching conditions is no lower than 1300 W but no higher than 2200 W, it is possible to improve etch uniformity within wafer. In this regard, FIGS. 10 to 12 show the results of tests performed to examine a relationship between the top power and the irregularity of etch depth. FIGS. 10, 11 and 12 show test results when the top power was set to 1000 W, 1400 W and 1600 W, respectively. The meanings of the graphs shown in FIGS. 10A, 11A and 12A are the same as those of the graph shown in FIG. 3A. Likewise, the meanings of the graphs shown in FIGS. 10B, 11B and 12B are the same as those of the graph shown in FIG. 3B.

Comparison between these graphs reveals that the etch rate increases mainly in the vicinity of the central part of the wafer as the top power increases, thus resulting in a decrease in the irregularity of etch depth. An increase in the top power facilitates decomposing of gases, thereby producing a fluorine-rich plasma. In addition, electron density increases easily in the central part of the wafer. Accordingly, a possible cause for the decrease in the irregularity of etch depth is that a fluorine-rich state was created in the central part of the wafer in particular and the etch rate increased in that part, thus reducing a difference in the etch depth.

Incidentally, an etching apparatus has a variety of consumable parts around a stage for fixing wafers. For example, a focus ring made of Si is located around a wafer. The wear of this focus ring made of Si affects the flow of gas passing above the wafer, thereby exercising an influence mainly on the depth and the film quality of depositions accumulating on the wafer. In addition, the resistance value of the focus ring varies according to the degree of wear thereof since the focus ring is located in the periphery of the stage, thereby affecting the state of convergence of a plasma. This also affects the film quality and thickness of depositions accumulating on the top surface of the wafer, as well as the orientation and the quantity of ions plunging into the wafer. Because of this phenomenon, the condition of a chamber varies on a day-to-day basis depending on the degree of wear of parts and there occurs a process shift, such as a variation in the etch depth between the central and edge parts of the wafer, in an etching apparatus used for production. It is therefore extremely important to set etching conditions in which a characteristic change in consumable parts are less influential to process characteristics.

In this regard, FIGS. 13A and 13B show the results of measuring etch depth profiles within wafer in cases where the present embodiment was applied. In contrast, FIGS. 14A and 14B show the results of measuring etch depth profiles within wafer in cases where the present embodiment was not applied. These figures are the results of optical critical dimension (OCD) measurement performed on patterns the line and space widths of which are equally 140 nm. The term "Uniformity" as used in the tables of each figure refers to a value calculated according to the formula "(max.−min.)/(2× Average)×100". FIGS. 13A and 14A show the results of measurement after parts in the chamber of the etching apparatus wore out, whereas FIGS. 13B and 14B show the results of measurement when the parts were new.

Comparison between these measurement results shows that the irregularity of etch depth changes depending on the degree of wear of parts in cases where the present embodiment was not applied (see FIG. 14). On the other hand, the irregularity of etch depth hardly depends on the degree of wear of parts in cases where the present embodiment was applied (see FIG. 14).

The method of manufacturing a semiconductor device in accordance with the present invention is not limited to the above-described embodiments but may be modified in various other ways. In addition to the combinations exemplified in the above-described embodiments, a variety of other combinations are conceivable with regard to combinations of the first and second insulating layers. For example, both the first and second insulating layers may be low-k dielectric layers. A combination of low-k dielectric layers composed of the same material (for example, SiOC) is also acceptable as long as one of them is a porous layer. In that case, it is preferable that the first insulating layer be the porous layer.

While in the above-described embodiments, an example has been shown wherein no etch stop layer is interposed between the first and second insulating layers, an etch stop layer may be interposed therebetween. In that case, it is possible to further improve etch uniformity.

Furthermore, while in the above-described embodiments an example has been shown wherein a high-frequency output is applied to both the upper and lower electrodes, an etching apparatus wherein the high-frequency output is applied only to one of the upper and lower electrodes may be used.

What is claimed is:
1. A method of manufacturing a semiconductor device, said method comprising:
    forming a second insulating layer over a first insulating layer;
    forming a mask over the second insulating layer;
    after said forming the mask, a first etching of the second insulating layer using the mask; and
    after said first etching, in an area of the first insulating layer and the second insulating layer which is not covered by the mask, performing a second etching of the second insulating layer and the first insulating layer,
    wherein, at said first etching, the second insulating layer is left over the first insulating layer such that the first insulating layer is not exposed,
    wherein, at the second etching, the left over second insulating layer is removed and the first insulating layer is etched, wherein a dielectric constant of the first insulating layer is less than a dielectric constant of the second insulating layer, and wherein a flow rate of oxygen in said second etching is more than a flow rate of oxygen in said first etching.

2. A method of manufacturing a semiconductor device according to the claim 1, wherein the first insulating layer includes Si, O, and C, and wherein the second insulating layer includes Si and O.

3. A method of manufacturing a semiconductor device according to the claim 2, wherein said first etching and said second etching are carried out as parts of a dual damascene process.

4. A method of manufacturing a semiconductor device according to the claim 2, wherein a first etching condition of said first etching includes applying $CHF_3$, $CF_4$, and Ar, and wherein a second etching condition of said second etching includes applying $CHF_3$, $CF_4$, Ar, and $O_2$.

5. A method of manufacturing a semiconductor device according to the claim 1, wherein the first insulating layer comprises SiOC, and wherein the second insulating layer comprises $SiO_2$, SiC, SiCN, or SiN.

6. A method of manufacturing a semiconductor device according to the claim 1, wherein a thickness of the left over second insulating layer after said first etching is between 10% to 40% of a thickness of the second insulating film before said first etching.

7. A method of manufacturing a semiconductor device according to the claim 1, wherein said first etching and said second etching are carried out as parts of a dual damascene process.

8. A method of manufacturing a semiconductor device according to the claim 1, wherein the mask comprises a resist film.

9. A method of manufacturing a semiconductor device according to the claim 1, wherein an etching time in said etching under said first etching is in a range from 60% to 90% of an etching time required to completely etch said second insulating layer.

10. A method of manufacturing a semiconductor device according to the claim 1, wherein a mixing ratio of the oxygen to other gases in said second etching is in a range from 0.4% to 2.6%.

11. A method of manufacturing a semiconductor device as claimed in claim 1, wherein said method is devoid of interposing an etch stop layer between said first and second insulating layers.

12. A method of manufacturing a semiconductor device as claimed in claim 1, wherein the first etching and the second etching are carried out as a part of a dual damascene process.

13. A method of manufacturing a semiconductor device as claimed in claim 1, wherein said first etching and said second etching comprise forming a trench.

14. A method of manufacturing a semiconductor device as claimed in claim 1, wherein said forming the second insulating layer over the first insulating layer comprises disposing the second insulating layer on a top surface of the first insulating layer.

15. A method of manufacturing a semiconductor device as claimed in claim 1, wherein the second insulating layer abuts a surface of the first insulating layer.

16. A method of manufacturing a semiconductor device as claimed in claim 1, wherein the first and second insulating layers comprise different materials from each other.

17. A method of manufacturing a semiconductor devices, said method comprising:

forming a first insulating layer;

forming a second insulating layer on the first insulating layer;

performing an etching in a first condition to make a first hole in the second insulating layer, the first hole having a depth that is less than a thickness of the second insulating layer such that a portion of the second insulating layer remains between the first hole and the first insulating layer; and performing an etching in a second condition to remove a remaining portion of the second insulating layer and to make a second hole in the first insulating layer, wherein said performing the etching in the second condition includes applying a larger flow rate of oxygen than said performing the etching in the first condition.

18. The method as claimed in claim 17, wherein the first and second holes are substantially equal in size to each other.

19. The method as claimed in claim 17, wherein the first and second insulating layers comprise different materials from each other.

20. The method as claimed in claim 17, wherein said forming the second insulating layer comprises disposing the second insulating layer over a top surface of the first insulating layer.

* * * * *